(12) United States Patent
Harbers et al.

(10) Patent No.: US 9,781,798 B2
(45) Date of Patent: Oct. 3, 2017

(54) LED-BASED ILLUMINATION SYSTEMS HAVING SENSE AND COMMUNICATION CAPABILITY

(71) Applicant: Xicato, Inc., San Jose, CA (US)

(72) Inventors: Gerard Harbers, Sunnyvale, CA (US); Barry Mark Loveridge, San Jose, CA (US); Martin Emil Mueller, Fremont, CA (US); Peter K. Tseng, San Jose, CA (US); Warren A. Kartadinata, Fremont, CA (US)

(73) Assignee: Xicato, Inc., San Jose, CA (US)

( * ) Notice: Subject to any disclaimer, the term of this patent is extended or adjusted under 35 U.S.C. 154(b) by 0 days.

(21) Appl. No.: 15/093,558

(22) Filed: Apr. 7, 2016

(65) Prior Publication Data

US 2016/0302280 A1  Oct. 13, 2016

Related U.S. Application Data

(60) Provisional application No. 62/144,846, filed on Apr. 8, 2015.

(51) Int. Cl.
*H05B 37/02* (2006.01)
*H05B 33/08* (2006.01)
(Continued)

(52) U.S. Cl.
CPC ....... *H05B 33/0854* (2013.01); *F21V 23/006* (2013.01); *F21V 23/0435* (2013.01);
(Continued)

(58) Field of Classification Search
CPC ............ H05B 33/0854; H05B 33/0809; H05B 33/0842; H05B 37/0272; F21V 23/006; F21V 23/0435
(Continued)

(56) References Cited

U.S. PATENT DOCUMENTS

| 5,959,316 A | 9/1999 | Lowery |
| 6,351,069 B1 | 2/2002 | Lowery et al. |

(Continued)

FOREIGN PATENT DOCUMENTS

| EP | 2280586 A2 | 2/2011 |
| JP | 2011044401 A | 3/2011 |

OTHER PUBLICATIONS

Invitation to Pay Additional Fees mailed on Jun. 8, 2016 for International Application No. PCT/US2016/026528 filed on Apr. 7, 2016 by Xicato, Inc., 7 pages.

(Continued)

*Primary Examiner* — Douglas W Owens
*Assistant Examiner* — Syed M Kaiser
(74) *Attorney, Agent, or Firm* — Silicon Valley Patent Group LLP

(57) ABSTRACT

An LED based illumination device includes a plurality of LEDs that emit light through an output port of a housing. The LED based illumination device includes a heat sink that is in thermal contact with the plurality of LEDs. A peripheral electrical circuit board is configured to be contained within the housing, e.g., surrounding at least a portion of the heat sink. The peripheral electrical circuit board may include a radio frequency (RF) transceiver configured to communicate data between the LED based illumination device and another electronic device. A primary electrical circuit board may be electrically coupled to the peripheral electrical circuit board and electrically coupled to the plurality of LEDs.

29 Claims, 10 Drawing Sheets

(51) Int. Cl.
| | | |
|---|---|---|
| *F21V 23/00* | (2015.01) | |
| *F21V 23/04* | (2006.01) | |
| *F21V 29/70* | (2015.01) | |
| *H05K 1/02* | (2006.01) | |
| *H05K 1/18* | (2006.01) | |
| *F21V 7/00* | (2006.01) | |
| *F21V 17/10* | (2006.01) | |
| *F21V 23/06* | (2006.01) | |
| *F21Y 105/10* | (2016.01) | |
| *F21K 9/64* | (2016.01) | |
| *F21Y 115/10* | (2016.01) | |
| *F21Y 101/02* | (2006.01) | |

(52) U.S. Cl.
CPC ......... *F21V 29/70* (2015.01); *H05B 37/0272* (2013.01); *H05K 1/0203* (2013.01); *H05K 1/0274* (2013.01); *H05K 1/181* (2013.01); *F21K 9/64* (2016.08); *F21V 7/00* (2013.01); *F21V 17/10* (2013.01); *F21V 23/0464* (2013.01); *F21V 23/06* (2013.01); *F21Y 2101/02* (2013.01); *F21Y 2105/10* (2016.08); *F21Y 2115/10* (2016.08); *H05K 2201/10098* (2013.01); *H05K 2201/10106* (2013.01); *H05K 2201/10151* (2013.01); *H05K 2201/10159* (2013.01)

(58) Field of Classification Search
USPC ..... 315/294, 70, 85, 185 R; 326/249.02, 294
See application file for complete search history.

(56) References Cited

U.S. PATENT DOCUMENTS

| | | | |
|---|---|---|---|
| 6,504,301 B1 | 1/2003 | Lowery | |
| 6,586,882 B1 | 7/2003 | Harbers | |
| 6,600,175 B1 | 7/2003 | Baretz et al. | |
| 6,680,569 B2 | 1/2004 | Mueller-Mach et al. | |
| 6,812,500 B2 | 11/2004 | Reeh et al. | |
| 7,126,162 B2 | 10/2006 | Reeh et al. | |
| 7,250,715 B2 | 7/2007 | Mueller et al. | |
| 7,479,662 B2 | 1/2009 | Soules et al. | |
| 7,564,180 B2 | 7/2009 | Brandes | |
| 7,614,759 B2 | 11/2009 | Negley | |
| 7,629,621 B2 | 12/2009 | Reeh et al. | |
| 2006/0022214 A1* | 2/2006 | Morgan | F21K 9/00 257/99 |
| 2007/0081336 A1 | 4/2007 | Bierhuizen et al. | |
| 2010/0204841 A1* | 8/2010 | Chemel | F21V 29/02 700/282 |
| 2012/0250324 A1* | 10/2012 | Kimiya | F21V 7/041 362/249.02 |
| 2013/0077306 A1* | 3/2013 | Lagutko | F21S 8/03 362/244 |
| 2013/0093325 A1* | 4/2013 | Scarpelli | H05B 37/00 315/85 |
| 2013/0181607 A1* | 7/2013 | Yotsumoto | H05B 37/00 315/70 |
| 2014/0070710 A1* | 3/2014 | Harris | H05B 33/0809 315/185 R |
| 2015/0021629 A1* | 1/2015 | Gershowitz | H05B 33/0842 257/88 |
| 2015/0279207 A1* | 10/2015 | Breuer | G08C 19/16 398/106 |

OTHER PUBLICATIONS

Machine translation in English of Abstract for JP2011044401 visited at www.espacenet.com on Jul. 21, 2016, 2 pages.
International Search Report and Written Opinion mailed on Aug. 16, 2016 for International Application No. PCT/US2016/026528 filed on Apr. 7, 2016 by Xicato, Inc., 21 pages.

* cited by examiner

LED-BASED ILLUMINATION SYSTEMS HAVING SENSE AND COMMUNICATION CAPABILITY

CROSS REFERENCE TO RELATED APPLICATIONS

This application claims priority under 35 USC 119 to U.S. Provisional Application No. 62/144,846, filed Apr. 8, 2015, which is incorporated by reference herein in its entirety.

TECHNICAL FIELD

The described embodiments relate to illumination devices that include Light Emitting Diodes (LEDs).

BACKGROUND

The use of LEDs in general lighting is becoming more desirable and prevalent. Typically, LED illumination devices are standalone units. It is desirable, however, to collect data with LED illumination devices and to be able to communicate that data to external devices.

SUMMARY

An LED based illumination device includes a plurality of LEDs that emit light through an output port of a housing. The LED based illumination device includes a heat sink that is in thermal contact with the plurality of LEDs. A peripheral electrical circuit board is configured to be contained within the housing, e.g., surrounding at least a portion of the heat sink. The peripheral electrical circuit board may include a radio frequency (RF) transceiver configured to communicate data between the LED based illumination device and another electronic device. A primary electrical circuit board may be electrically coupled to the peripheral electrical circuit board and electrically coupled to the plurality of LEDs.

In one implementation, an LED based illumination device includes a plurality of LEDs mounted to a top surface of an LED mounting board, wherein the LED mounting board includes a heat dissipating bottom surface opposite the top surface of the LED mounting board; a heat sink disposed below the LED mounting board and in contact with the heat dissipating bottom surface; a peripheral electrical circuit board disposed below light emitting surfaces of the plurality of LEDs and surrounding at least a portion of the heat sink; a primary electrical circuit board electrically coupled to the peripheral electrical circuit board and electrically coupled to the LED mounting board; and a housing configured to capture the LED mounting board, the heat sink and the peripheral electrical circuit board.

In one implementation, an LED based illumination device includes a housing configured to capture an LED based light engine that includes a plurality of LEDs mounted to an LED mounting board, wherein an amount of light emitted by the LED based light engine passes through an output port of the housing, wherein the housing is configured to be attachable to a heat sink such that a bottom surface of the LED mounting board is in contact with the heat sink when the housing is attached to the heat sink; a peripheral electrical circuit board configured to be captured by the housing, wherein the peripheral electrical circuit board includes a radio frequency (RF) transceiver configured to communicate data between the LED based illumination device and another electronic device.

In one implementation, a light control and data interface module includes a primary electrical circuit board coupleable to an electrical power supply and an LED based light engine, the primary electrical circuit board configured to receive an amount of electrical power from the electrical power supply and supply electrical current to the LED based light engine; and a peripheral electrical circuit board coupled to the primary electrical circuit board, wherein the primary electrical circuit board is configured to supply electrical power to the peripheral electrical circuit board, and wherein the peripheral electrical circuit board includes a radio frequency (RF) transceiver configured to communicate data to an external electronic device.

DETAILED DESCRIPTION

Reference will now be made in detail to background examples and some embodiments of the invention, examples of which are illustrated in the accompanying drawings.

Figure 1:
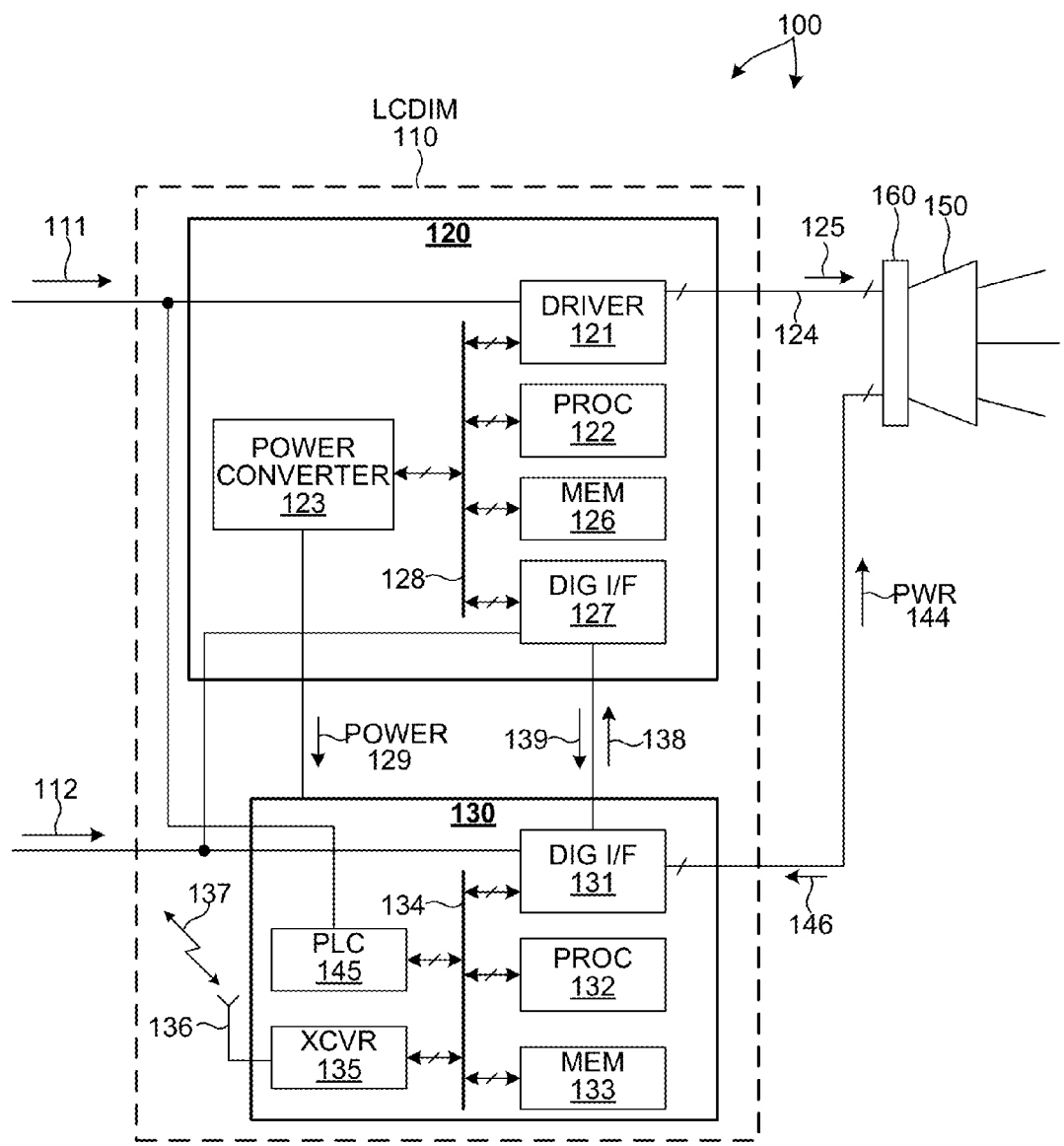
FIG. 1 depicts an LED based illumination device that includes a Light Control and Data Interface Module (LCDIM), in an exemplary, non-limiting embodiment.

FIG. 1 depicts an LED based illumination device 100 in an exemplary, non-limiting embodiment. LED based illumination device 100 includes a Light Control and Data Interface Module (LCDIM) 110 configured to supply electrical power to an LED based light engine 160. In addition, LCDIM 110 also integrates light control, power conversion, data acquisition, data processing, and communication capability.

In the embodiment depicted in FIG. 1, LCDIM 110 includes a primary electrical circuit board (ECB) 120 that includes an LED driver 121 and a peripheral ECB 130 that includes communication capability such as wireless transceiver 135, which may be a radio frequency transceiver. In this manner, heat generated by LED driver 121 may be effectively dissipated by locating the primary ECB 120 in close proximity to a heat sink, while sensors and communication components located on peripheral ECB 130 may be located further from the heat sink and closer to the environment being used as a communication medium (e.g., free space around LCDIM 110).

Figure 2:
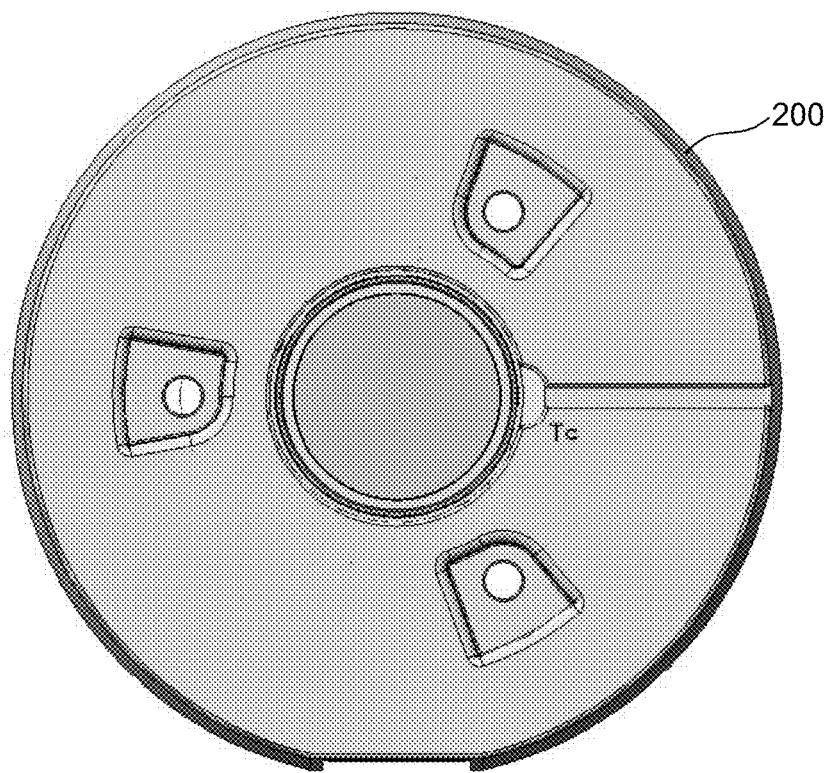
FIGS. 2 and 3 depict a top view and a side view, respectively, of an LED based illumination device including a LCDIM.
Figure 3:
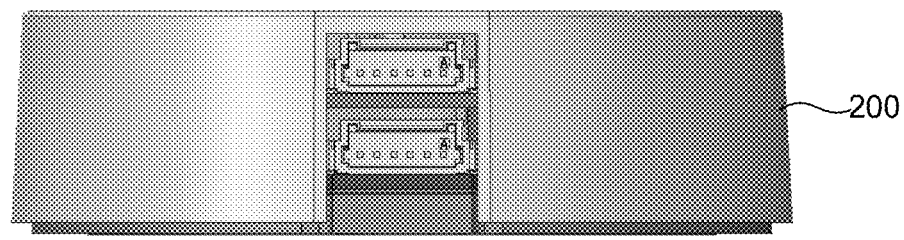

FIGS. 2 and 3 depict a top view and a side view, respectively, of an LED based illumination device 200 including a LCDIM. An example of such a lighting device is the Xicato Intelligent Module (XIM) manufactured by Xicato, Inc., San Jose, Calif. (USA).

Figure 4:
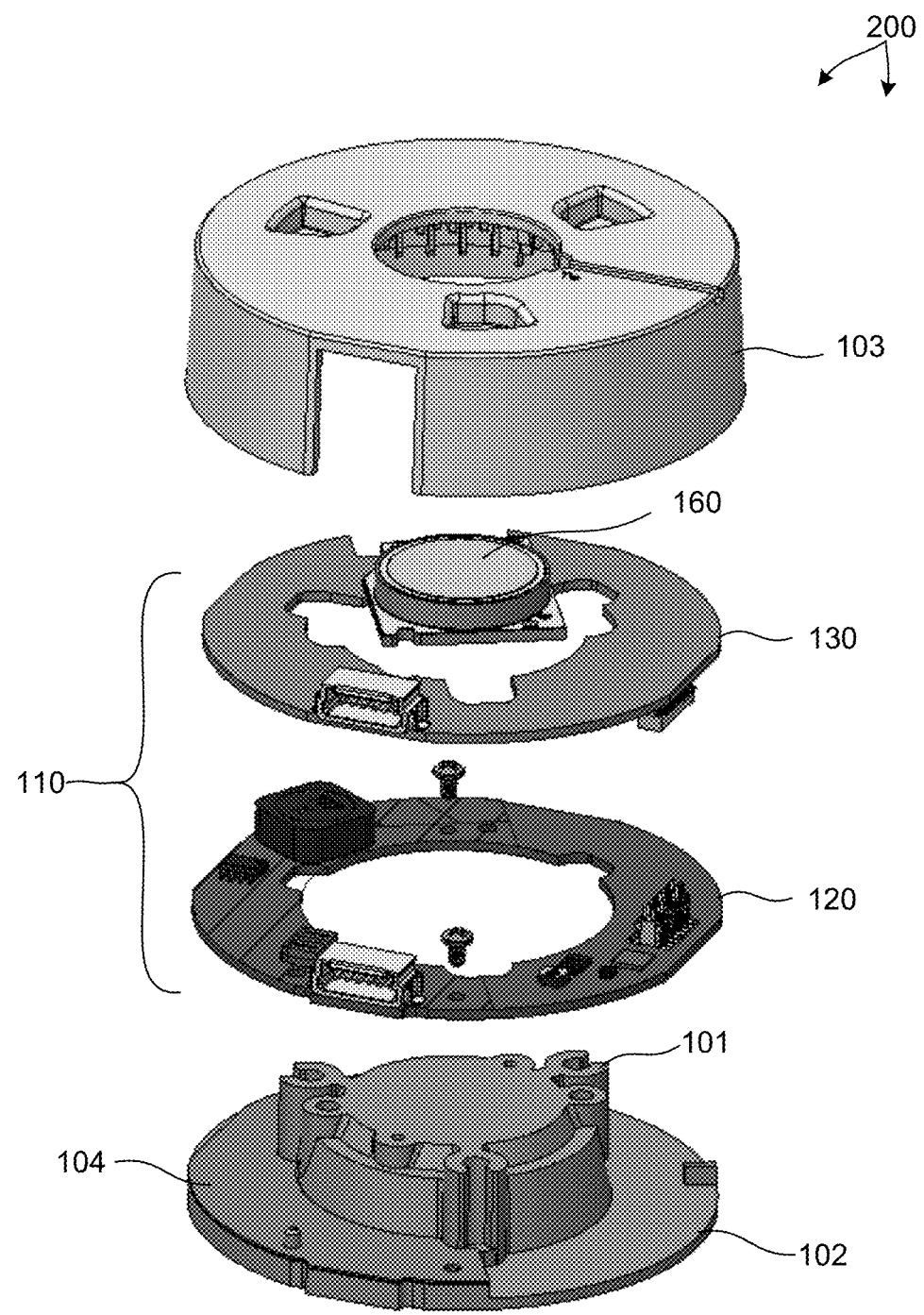
FIG. 4 depicts an exploded view illustrating components of LED based illumination device as depicted in FIGS. 2-3.

FIG. 4 depicts an exploded view illustrating components of LED based illumination device 200 as depicted in FIGS. 2-3. As depicted in FIG. 4, LED based illumination device 200 includes LED based light engine 160, LCDIM 110, including primary ECB 120 and peripheral ECB 130, heat sink 101, mounting plate 102, with a primary ECB 120 support 104, and housing 103.

The assembled LED based illumination device 200 mechanically integrates the LED based light engine with the LCDIM within a common housing. However, in general, one or more components of LED based illumination device 200 may be mechanically separated from the others. In these embodiments, one or more components may be separately located on a light fixture and electrically coupled to the other components by suitable wiring and connectors. In some embodiments, LED based light engine 160 is assembled within a simple housing to facilitate attachment to a heat sink. An example of such a lighting device is the Xicato Thin Module (XTM) manufactured by Xicato, Inc., San Jose, Calif. (USA). In this example, one or more components of LCDIM 110 are packaged in a separate housing, and this assembly is electrically coupled to the LED based light engine by a wired connection. In some other embodiments, LED based light engine 160 is assembled with the primary ECB 120 within a shared housing to facilitate attachment to a heat sink. The peripheral ECB 130 is packaged in a separate housing, and this assembly is electrically coupled to the LED based light engine 160 and the primary ECB 120 by a wired connection. In some other embodiments, LED based light engine 160 is assembled with the peripheral ECB 130 within a shared housing to facilitate attachment to a heat sink. The primary ECB 120 is packaged in a separate housing, and this assembly is electrically coupled to the LED based light engine 160 and the peripheral ECB 130 by a wired connection. In some other embodiments, LED based light engine 160, the peripheral ECB 130, and the primary ECB 120 are all packaged in separate housings and are electrically coupled together by a wired connection.

Figure 5:
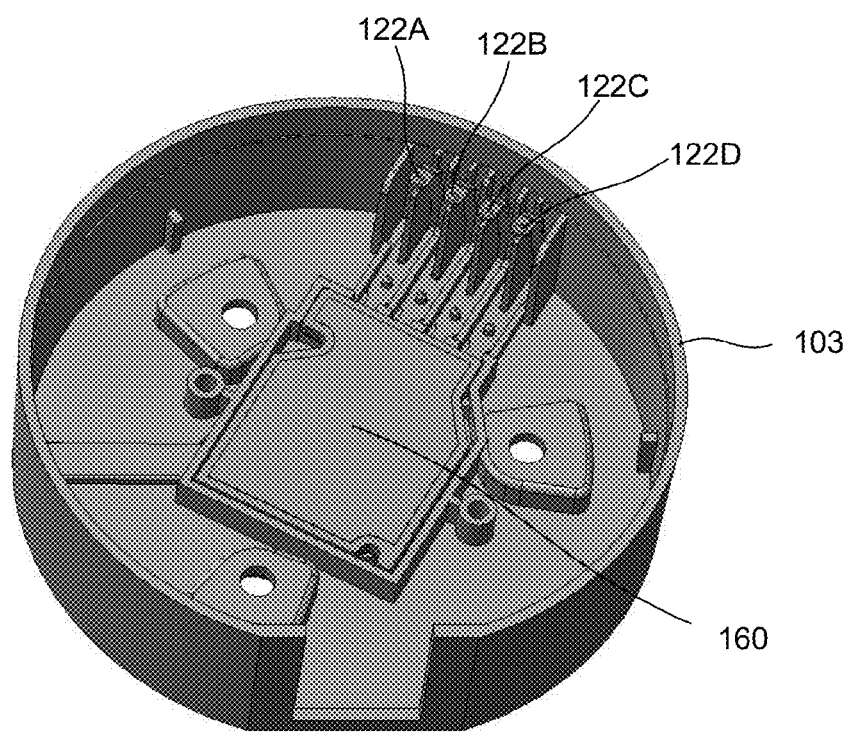
FIG. 5 depicts a bottom perspective view of the housing and LED based light engine and shows compliant contacts configured to electrically couple a primary electrical circuit board and the LED based light engine.
Figure 6:
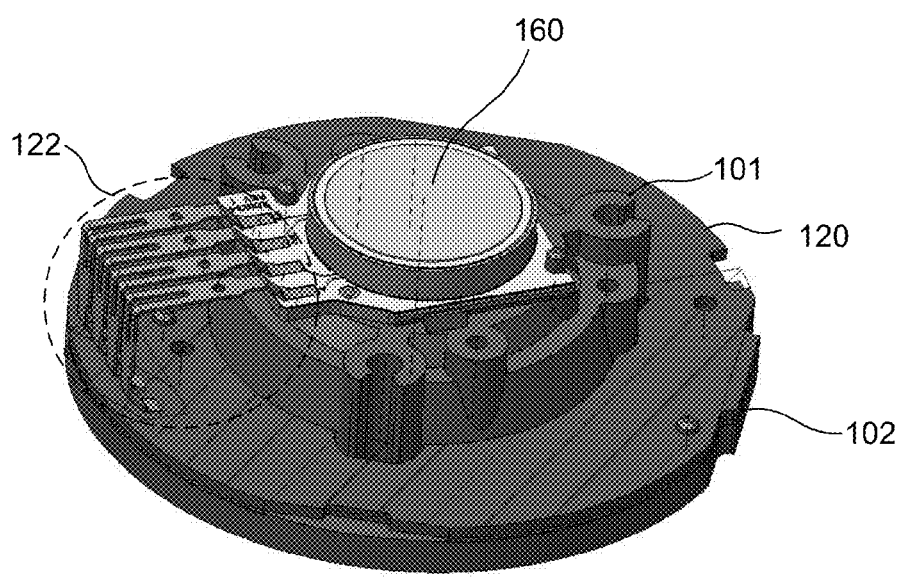
FIG. 6 depict top perspective view of the primary electrical circuit board and LED based light engine and shows the compliant contacts configured to electrically couple the primary electrical circuit board and the LED based light engine.
Figure 7:
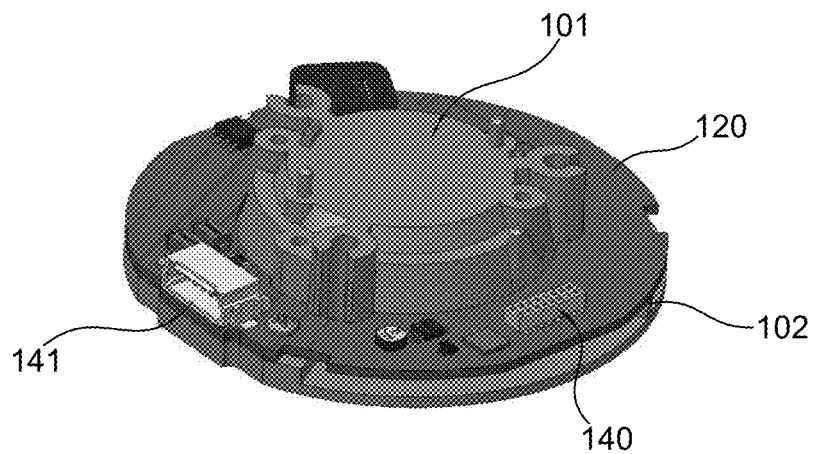
FIG. 7 depicts the primary electrical circuit board fixed to a mounting plate and surrounding the heat sink.
Figure 8:
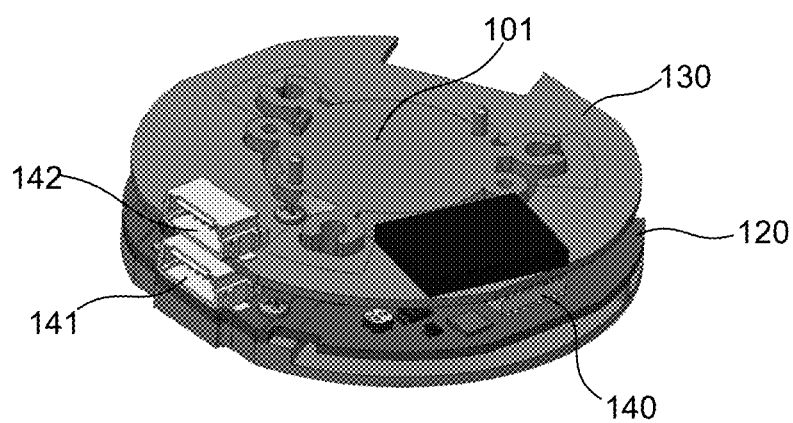
FIG. 8 is similar to FIG. 7 and depicts a peripheral electrical circuit board fixed to the heat sink.

It should be understood that as defined herein an LED based illumination device is not an LED, but is an LED light source or fixture or component part of an LED light source or fixture. As depicted in FIGS. 2-8, LED based illumination device 200 includes an LED based light engine 160 configured to generate an amount of light. LED based light engine 160 is coupled to heat sink 101 to promote heat extraction from LED based light engine 160. FIG. 5 depicts a bottom perspective view of the housing 103 and LED based light engine 160 and shows compliant contacts configured to electrically couple a primary electrical circuit board and the LED based light engine. FIG. 6 depict top perspective view of the primary electrical circuit board 120 and LED based light engine 160 and shows the compliant contacts configured to electrically couple the primary electrical circuit board and the LED based light engine. FIG. 7 depicts the primary electrical circuit board 120 fixed to a mounting plate 102 and surrounding the heat sink 101. FIG. 8 is similar to FIG. 7 and depicts a peripheral electrical circuit board 130 fixed to the heat sink 101. Primary ECB 120 and peripheral ECB 130 are shaped to fit around heat sink 101. LED based light engine 160, primary ECB 120, peripheral ECB 130, and heat sink 101 are enclosed between mounting plate 102 and housing 103. As illustrated in FIG. 4, the heat sink 101 and mounting plate 102 may be integrally coupled, e.g., manufactured from the same piece of material. If desired, however, heat sink 101 and mounting plate 102 may be separate manufactured and heat sink 101 mounted to mounting plate 102. An optional reflector retainer (not shown) is coupled to housing 103. The reflector retainer is configured to facilitate attachment of different reflectors to the LED based illumination device 200.

It is advantageous to separate the electronic functionality of LCDIM 110 across two or more electrical circuit boards, as depicted in FIGS. 2-8, to minimize logistical complexity. For example, in a network of LED based illumination devices, certain devices may include different functionality than others. Common functionality is included on the primary ECB associated with each device. In this manner each manufactured device includes the same primary ECB. However, differing functionality is included in a different peripheral ECB. In this manner, one or more different devices may include different peripheral ECBs. For example, a peripheral ECB associated with one LED based illumination device may include digital addressable lighting interface (DALI) master functionality and a peripheral ECB associated with another LED based illumination device may not include DALI master functionality.

Many different configurations may be contemplated, however, in general, the electronic functionality of LCDIM 110 as described herein may be distributed across the primary ECB and the peripheral ECB in any suitable manner.

In the embodiment depicted in FIG. 1, LED driver 121 of primary ECB 120 is configured to supply power to one or more LEDs of the LED based light engine 160 over a wired connection 124 between primary ECB 120 and LED based light engine 160. In one embodiment, LED driver 121 is a direct current to direct current (DC/DC) power converter. The DC/DC power converter receives electrical power signals 111 (e.g., 48 Volt supply voltage) supplied to primary ECB 120. The electrical power signals 111 are processed by the DC/DC power converter to generate current signals 125 supplied to the LEDs of LED based light engine 160. In some other embodiments, LED driver 121 is configured as an AC/DC power converter configured to convert AC input power signals to DC current signals supplied to the LEDs of LED based light engine 160. In some other embodiments, LED driver 121 is configured as an AC/AC power converter configured to convert AC input power signals to AC current signals supplied to the LEDs of LED based light engine 160 (e.g., when LED based light engine 160 includes AC LEDs).

In another aspect, LED based illumination device 200 includes compliant electrical contact elements configured to electrically couple LED based light engine 160 to primary ECB 120. Compliant contact elements include formed, elastic, metal contacts that are assembled within LED based illumination device 200 with an interference fit that deforms the elastic, metal contacts and ensures a consistent electrical contact. FIGS. 5-6 depict compliant contacts 122A-D configured to electrically couple primary ECB 120 and LED based light engine 160 in one embodiment. In the depicted embodiment, LED based light engine 160 and compliant contacts 122A-D are mounted to housing 103. Housing 103 is disposed over heat sink 101 and mechanically coupled to heat sink 101 with a removeable fastener (e.g., screws) or a press fit feature. Fastening housing 103 to heat sink 101 brings compliant contacts 122A-D into mechanical and electrical contact with primary ECB 120. As depicted in FIGS. 5-6, compliant contacts 122A-D extend from LED based light engine 160 in a direction approximately parallel to the light emitting surface of LED based light engine 160. The compliant contacts 122A-D are then formed with a ninety degree bend such that they continue to extend approximately perpendicular to the light emitting surface of LED based light engine 160 toward the surface of primary ECB 120.

FIG. 7 depicts primary ECB 120 fixed to mounting plate 102 and surrounding heat sink 101. Primary ECB 120 includes a connector 141 configured to be coupled to an external electronic device such as a power supply (e.g., 48 Volt power supply, low voltage power supply, control gear, network infrastructure, external sensors, etc.). In addition, a connector 140 is employed to couple primary ECB 120 and peripheral ECB 130. Primary ECB 120 includes a portion of connector 140 and peripheral ECB 130 includes a mating portion of connector 140. In this manner, connector 140 is employed to electrically couple primary ECB 120 to peripheral ECB 130 upon assembly as depicted in FIG. 8. Peripheral ECB 130 also includes connector 142 configured to be coupled to an external electronic device such as a power supply (e.g., 48 Volt power supply, low voltage power supply, control gear, network infrastructure, external sensors, etc.).

In another aspect, as illustrated in FIG. 1, primary ECB 120 includes a power converter 123 configured to supply low voltage electrical power signals 129 to peripheral ECB 130. In this manner, electrical power signals 111 can be used to supply electrical power to LED driver 121 and electrical power to peripheral ECB 130 after power conversion by power converter 123. In some embodiments, power converter 123 is a DC/DC power converter that steps down the voltage of electrical signals 111 to a low voltage range (e.g., less than five volts) suitable for powering the electronic circuitry of peripheral ECB 130. In some embodiments, peripheral ECB 130 may have a separate power converter. In addition, the power converter on peripheral ECB 130 may be used to supply low voltage (e.g., less than five volts) power to the circuitry on the primary ECB 120.

In yet another aspect, peripheral ECB 130 includes a wireless communications interface. In some embodiments the wireless communications interface is configured to transmit and receive communications or control signals 137 to and from the peripheral ECB 130. The wireless communications interface includes a wireless transceiver 135 operable in accordance with a wireless communications protocol, and one or more associated antennas 136 mounted to LED based illumination device 100. The wireless transceiver 135 may be a radio frequency transceiver 135. Additionally, while a transceiver 135 is described, it should be understood that the wireless transceiver 135 may be a wireless receiver, a wireless transmitter or both a wireless receiver and wireless transmitter. Any suitable wireless communications protocol may be contemplated, (e.g., Bluetooth, 802.11, Zigbee, cellular modem, etc.). In some embodiments, the wireless communications interface is configured to transmit communication signals from the peripheral ECB 130. The wireless communications interface includes a wireless transmitter operable in accordance with a wireless communications protocol, and one or more associated antennas mounted to LED based illumination device 100. In one example, a wireless transmitter operable in accordance with an iBeacon protocol may be employed to broadcast location information.

In some embodiments, one or more antennas are mounted to the external facing surface(s) of LED based illumination device 100 to maximize communication efficiency between LED based illumination device 100 and a remotely located communications device (e.g., router, mobile phone, or other computing system). In some embodiments, an antenna is integrated into the peripheral ECB 130. In some other embodiments, the antenna is integrated into the primary ECB 120. In some other embodiments, the antenna is integrated into housing 103, for example, by molding the antenna into the housing structure or attaching the antenna to a surface of the housing structure. In some other embodiments, the antenna is integrated into the mounting board of the LED based light engine 160.

As depicted in FIG. 1, primary ECB 120 includes an internal communications bus 128 coupled to various components of primary ECB 120 including processor 122, memory 126, digital interface 127, power converter 123, and LED driver 121. Similarly, peripheral ECB 130 includes an internal communications bus 134 coupled to various components of peripheral ECB 130 including processor 132, memory 133, digital interface 131, and transceiver 135.

In a further aspect, any of memory 126 of primary ECB 120 and memory 133 of peripheral ECB 130 stores identification data, operational data such as temperature history, current history, etc. For example, an identification number, a network security key, commissioning information, etc. may be stored on either, or both of these memories.

In another further aspect, peripheral ECB 130 includes processor readable instructions stored on memory 133 that cause processor 132 to receive data 139 from primary ECB 120 and wirelessly communicate this data from LED based illumination device 100 over transceiver 135. In this manner, processor 132 on board peripheral ECB 130 aggregates information collected by primary ECB 120 and provides control over the communication of this information from LED based illumination device 100 to an external electronic device (e.g., building management server, portable electronic device such as a mobile phone or tablet computer, etc.). By way of non-limiting example, data 139 may include temperature data, electrical performance data, optical performance data, identification data such as a serial number, etc.

In another further aspect, peripheral ECB 130 includes processor readable instructions stored on memory 133 that cause processor 132 to receive sensor signals (e.g., sensor signals 146) from any number of sensors coupled to LED based illumination device 100 and wirelessly communicate the collected data from LED based illumination device 100 over transceiver 135. In some embodiments, the peripheral ECB 130 may communicate the collected data from LED based illumination device 100 using wired based communication interfaces—e.g., Ethernet, PLC, etc. In this manner, processor 132 on board peripheral ECB 130 aggregates information collected by LED based illumination device 100 and provides control over the communication of this information from LED based illumination device 100 to an external electronic device (e.g., building management server, portable electronic device such as a mobile phone or tablet computer, etc.).

As depicted in FIG. 1, sensor signals 146 from LED based light engine 160 are received by peripheral ECB 130. By way of non-limiting example, sensor signals 146 may include a serial number stored in a memory on board LED based light engine 160, temperature data, flux data, etc.

In general, sensor signals received by peripheral ECB 130 may originate from a sensor directly coupled to peripheral ECB 130, a sensor coupled to LED based light engine 160, a sensor coupled to reflector 150, an external sensor electrically coupled to peripheral ECB 130, a sensor coupled to primary ECB 120, a sensor signal coming in over a wireless channel, or any combination of these sensors.

Many different types of sensors may be coupled to LED based illumination device 100. By way of non-limiting example, one or more occupancy sensors, ambient light sensors, temperature sensors, cameras, microphones, visual indicators such as low power LEDs, ultrasonic sensors, vibration sensors, pressure sensors, orientation sensors, and photodetectors may be coupled to LED based illumination device 100 and configured to communicate signals to peripheral ECB 130.

Figure 10:
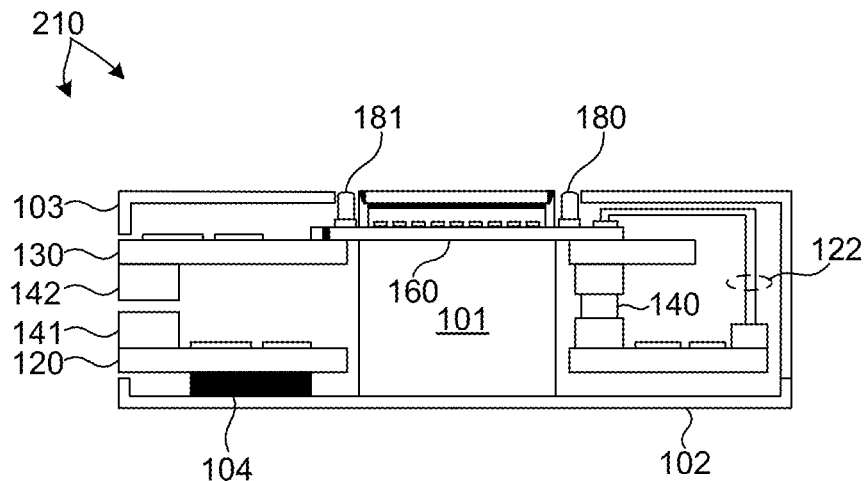
FIG. 10 depicts a cross-sectional illustration of the LED based illumination device including optical sensors located on the LED based light engine outside the light conversion cavity.
Figure 11:
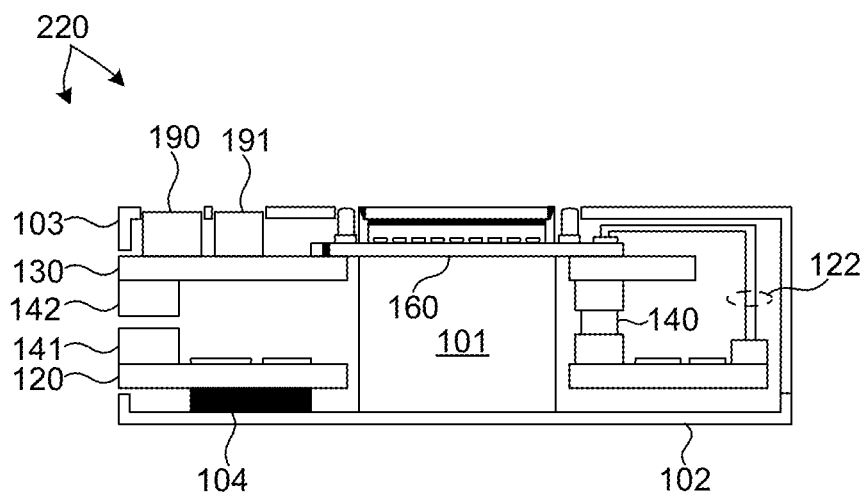
FIG. 11 depicts a cross-sectional illustration of the LED based illumination device including sensors that are directly coupled to peripheral electrical circuit board and exposed to the environment through voids in the housing.

In some embodiments, it is desireable to locate sensors in areas that are exposed to ambient light of the environment. While these sensors may be exposed to light emitted from the LED based light engine 160, as well, these signals may be separated in the time domain or through the use of optical filters, such as filters that filter infrared or ultraviolet light, which the LEDs may not produce. FIG. 10 depicts a cross-sectional illustration of LED based illumination device 210 including optical sensors 180 and 181 located on LED based light engine 160 outside the light conversion cavity. In some other examples, a sensor (e.g., silicon photo diode) is located within the light conversion cavity. FIG. 11 depicts a cross-sectional illustration of LED based illumination device 220 including sensors 190 and 191 that are directly coupled to peripheral ECB 130 and exposed to the environment through voids in housing 103.

In some other examples, sensors may be mounted to a reflector assembly that is electrically coupled to peripheral ECB 130 (e.g., via an electrical connector, contacts, or inductively coupled).

Figure 12:
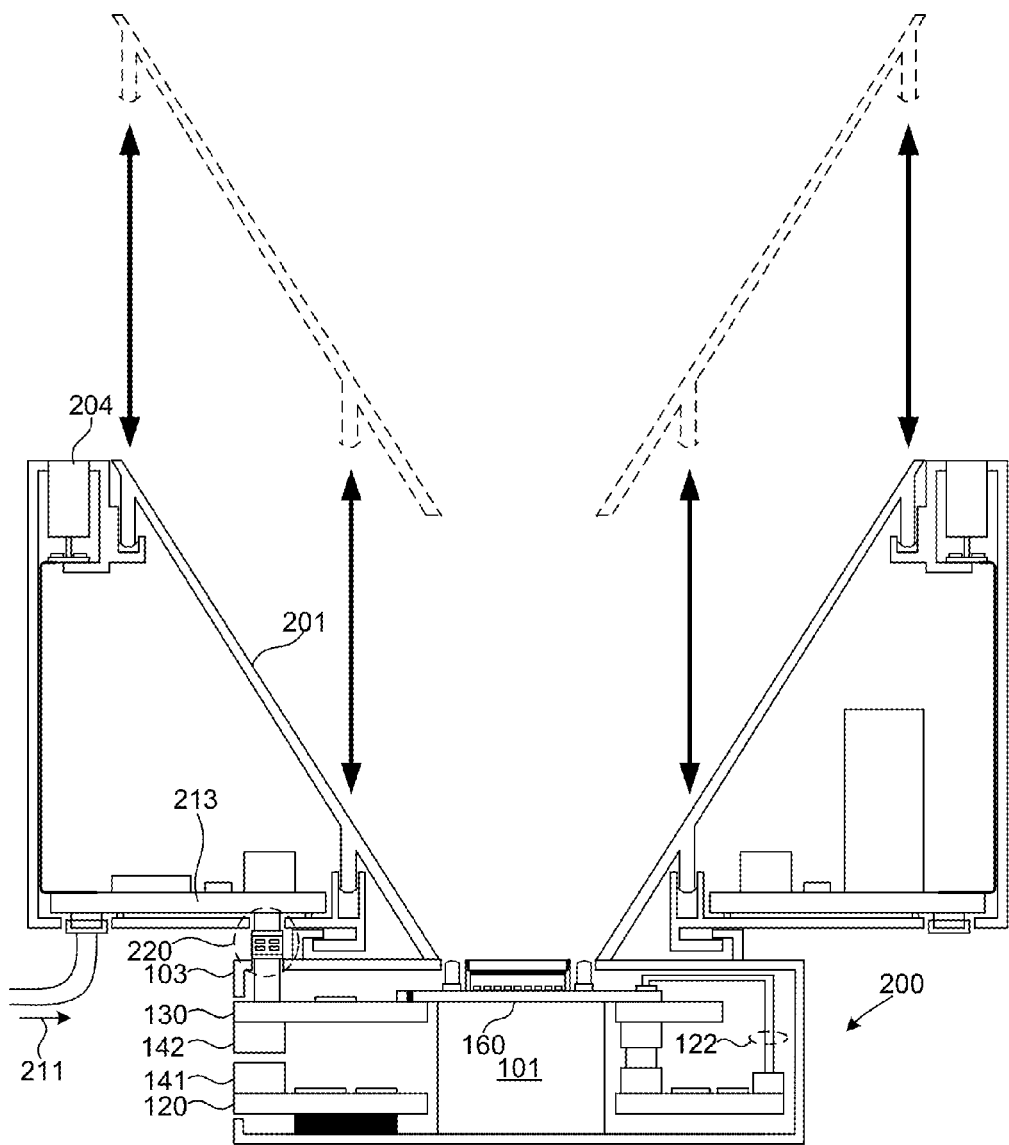
FIG. 12 depicts a cross-sectional illustration of the LED based illumination device including a detachably mounted reflector assembly including sensing capability.

FIG. 12 depicts a reflector assembly including sensing capability detachably mounted to LED based illumination device 200 in one embodiment. The reflector housing includes a reflector 201, sensors 204, and an electronics interface board 213. In the depicted embodiment, the reflector housing includes an outward facing surface. In other words, at least one surface of the reflector housing faces away from the light source of LED based illumination device 200 and toward the environment illuminated by LED based illumination device 200. Sensors (e.g., sensor 204) are mounted in the reflector housing along the outward facing surface. In this manner, the sensors are sensitive to physical signals directed toward LED based illumination device 200. Signals generated by the sensors are communicated to an electrical interface board 213 coupled to the reflector housing for further processing and communication to LED based illumination device 200.

Reflector 201 includes an input port configured to receive a first amount of light emitted from the LED based illumination device 200 and an output port through which light passes toward the environment. The reflecting surface(s) of reflector 201 are configured to redirect at least a portion of the light emitted from the LED based illumination device toward the output port.

The reflector assembly is communicatively coupled to peripheral ECB 130 of LED based illumination device 200 by a connector 220, and the reflector assembly is configured to transmit and receive communications signals to and from the peripheral ECB 130. In one embodiment, the electronics interface board 213 is configured to route communications between the sensor 204 and the LED based illumination device 200 over a wired interface, such as a four pin interface including two power pins and two communication pins (e.g. I2C interface). In some other embodiments, electrical interface board 213 includes a coiled conductor and peripheral ECB 130 includes a complementary coiled conductor. The conductors are configured to form an inductive coupling operable in accordance with a near field communications (NFC) protocol. In this manner, signals and power may be passed between the reflector assembly and LED based illumination device 200.

Many different types of sensors may be mounted to the reflector assembly. By way of non-limiting example, one or more occupancy sensors, ambient light sensors, temperature sensors, cameras, microphones, visual indicators such as low power LEDs, ultrasonic sensors, vibration sensors, pressure sensors, orientation sensors, and photodetectors may be mounted to the reflector assembly.

In some embodiments, additional sensors may be electrically coupled to the reflector assembly and data signals 211 generated by these external sensors are communicated to the electronic interface board 213. The collected data may then be communicated to LED based illumination device 200 as described hereinbefore.

In general, any outwardly facing surface of LED based illumination device is suitable for any sensor collecting data from the ambient light in the environment illuminated by LED based illumination device. However, in some embodiments, one or more sensors may be located in areas of the LED based illumination device that are not necessarily exposed to the environment illuminated by LED based illumination device. For example, one or more temperature sensors, vibration sensors, and pressure sensors may coupled to peripheral ECB 130 or primary ECB 120 to monitor environmental parameters such as temperature, etc., near LED based illumination device. For example, a temperature sensor may be mounted close to electronic components of peripheral ECB 130 to monitor operating temperatures to minimize component failure.

In another further aspect, as illustrated in FIG. 1, peripheral ECB 130 includes processor readable instructions stored on memory 133 that cause processor 132 to receive a control signal 112, determine a desired luminous output of the LED based illumination device based on the control signal, and transmit a command signal 138 to the primary ECB 120 to change the luminous output of the LED based illumination device. In this manner, processor 132 on board peripheral ECB 130 provides control over the light emitted from the LED based illumination device 100.

In some embodiments, control signal 112 is an analog control signal such as a control signal adhering to a 0-10 Volt standard. In some other embodiments, control signal 112 is a digital signal such as a control signal adhering to a Digital Addressable Lighting Interface (DALI) standard, a DMX standard, Ecosystem® by Lutron, Inc., etc.

In another further aspect, peripheral ECB 130 includes processor readable instructions stored on memory 133 that cause processor 132 to receive a control signal 137 received by transceiver 135, determine a desired luminous output of the LED based illumination device based on the control signal, and transmit a command signal 138 to the primary ECB 120 to change the luminous output of the LED based illumination device.

In another further aspect, command signal 138 determined by processor 132 is based on sensor signals received from a sensor coupled to the peripheral ECB 130, a sensor coupled to LED based light engine 160, a sensor coupled to reflector 150, an external sensor electrically coupled to peripheral ECB 130, a sensor coupled to primary ECB 120, or any combination of these sensors.

In yet another further aspect, peripheral ECB 130 is configured to supply power signals 144 to a plurality of sensors coupled to peripheral ECB 130. In some embodiments, an inductive coupling between peripheral ECB 130 is further configured to transmit electrical power to the reflector assembly. In some examples, up to five Watts of electrical power may be transmitted in this manner.

In yet another further aspect, as illustrated in FIG. 12, the electrical interface board 213 includes a power bus configured to supply power to the plurality of sensors coupled to the reflector housing. In this manner, electrical interface board 213 acts as a power supply to sensors attached to the reflector assembly.

In yet another aspect, the reflector of the reflector assembly is removably coupled to the reflector housing. As depicted in FIG. 12, reflector 201 includes engaging features that allow for selective attachment and detachment of reflector 201. In this manner, different reflector shapes can be interchangeably located within the reflector housing to satisfy particular optical requirements.

In some embodiments, as illustrated in FIG. 1, peripheral ECB 130 includes a Power Line Communication (PLC) module 145 operable to receive an electrical power signal (e.g., signal 111) and decode a communication signal from the electrical power signal. Similarly, the PLC module is operable to transmit an electrical power signal that includes a communication signal component. These communication signals may be employed to control the light output of the LED based illumination device and communicate information between the LED based illumination device and an external electronic device.

Figure 9:
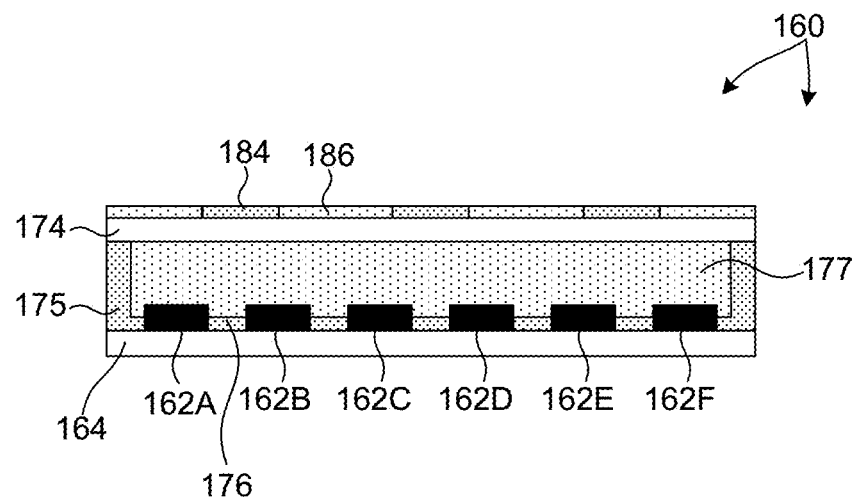
FIG. 9 depicts an LED based light engine including a one or more LED die or packaged LEDs and a mounting board to which LED die or packaged LEDs are attached.

FIG. 9 is illustrative of LED based light engine 160 in one embodiment. LED based light engine 160 includes one or more LED die or packaged LEDs and a mounting board to which LED die or packaged LEDs are attached. In addition, LED based light engine 160 includes one or more transmissive elements (e.g., windows or sidewalls) coated or impregnated with one or more wavelength converting materials to achieve light emission at a desired color point.

As illustrated in FIG. 9, LED based light engine 160 includes a number of LEDs 162A-F mounted to mounting board 164 in a chip on board (COB) configuration. The spaces between each LED are filled with a reflective material 176 (e.g., a white silicone material). In addition, a dam of reflective material 175 surrounds the LEDs 162 and supports transmissive element 174, which may be, e.g., a plate. The space between LEDs 162 and transmissive element 174 is filled with an encapsulating optically translucent material 177 (e.g., silicone) to promote light extraction from LEDs 162 and to separate LEDs 162 from the environment.

In the depicted embodiment, the dam of reflective material 175 is both the thermally conductive structure that conducts heat from transmissive element 174 to LED mounting board 164 and the optically reflective structure that reflects incident light from LEDs 162 toward transmissive element 174.

LEDs 162 can emit different or the same colors, either by direct emission or by phosphor conversion, e.g., where phosphor layers are applied to the LEDs as part of the LED package. The illumination device 100 may use any combination of colored LEDs 162, such as red, green, blue, ultraviolet, amber, or cyan, or the LEDs 162 may all produce the same color light. Some or all of the LEDs 162 may produce white light. In addition, the LEDs 162 may emit polarized light or non-polarized light and LED based illumination device 100 may use any combination of polarized or non-polarized LEDs. In some embodiments, LEDs 162 emit either blue or UV light because of the efficiency of LEDs emitting in these wavelength ranges. The light emitted from the illumination device 100 has a desired color when LEDs 162 are used in combination with wavelength converting materials on transmissive element 174, for example. By tuning the chemical and/or physical (such as thickness and concentration) properties of the wavelength converting materials and the geometric properties of the coatings on the surface of transmissive element 174, specific color properties of light output by LED based illumination device 100 may be specified, e.g., color point, color temperature, and color rendering index (CRI).

For purposes of this patent document, a wavelength converting material is any single chemical compound or mixture of different chemical compounds that performs a color conversion function, e.g., absorbs an amount of light of one peak wavelength, and in response, emits an amount of light at another peak wavelength.

By way of example, phosphors may be chosen from the set denoted by the following chemical formulas: $Y3Al5O12$:Ce, (also known as YAG:Ce, or simply YAG) $(Y,Gd)3Al5O12$:Ce, CaS:Eu, SrS:Eu, $SrGa2S4$:Eu, $Ca3(Sc,Mg)2Si3O12$:Ce, $Ca3Sc2Si3O12$:Ce, $Ca3Sc2O4$:Ce, $Ba3Si6O12N2$:Eu, $(Sr,Ca)AlSiN3$:Eu, $CaAlSiN3$:Eu, $CaAlSi(ON)3$:Eu, $Ba2SiO4$:Eu, $Sr2SiO4$:Eu, $Ca2SiO4$:Eu, $CaSc2O4$:Ce, $CaSi2O2N2$:Eu, $SrSi2O2N2$:Eu, $BaSi2O2N2$:Eu, $Ca5(PO4)3Cl$:Eu, $Ba5(PO4)3Cl$:Eu, $Cs2CaP2O7$, $Cs2SrP2O7$, $Lu3Al5O12$:Ce, $Ca8Mg(SiO4)4Cl2$:Eu, $Sr8Mg(SiO4)4Cl2$:Eu, $La3Si6N11$:Ce, $Y3Ga5O12$:Ce, $Gd3Ga5O12$:Ce, $Tb3Al5O12$:Ce, $Tb3Ga5O12$:Ce, and $Lu3Ga5O12$:Ce.

In one example, the adjustment of color point of the illumination device may be accomplished by adding or removing wavelength converting material from transmissive element 174. In one embodiment a red emitting phosphor 186 such as an alkaline earth oxy silicon nitride covers a portion of transmissive element 174, and a yellow emitting phosphor 184 such as a YAG phosphor covers another portion of transmissive element 174.

In another example, the adjustment of color point of light emitted from the LED based illumination device may be accomplished by adjusting electrical currents supplied to different LEDs of the illumination device. In this manner, the color rendering index (CRI), correlated color temperature (CCT), or any other relevant color metric may be tuned based on the electrical currents supplied to different LEDs of the illumination device. In one example, the electrical currents are adjusted by primary ECB 120 as described hereinbefore.

In some embodiments, the phosphors are mixed in a suitable solvent medium with a binder and, optionally, a surfactant and a plasticizer. The resulting mixture is deposited by any of spraying, screen printing, blade coating, jetting, or other suitable means. By choosing the shape and height of the transmissive element 174, and selecting which portions of transmissive element 174 will be covered with a particular phosphor or not, and by optimization of the layer thickness and concentration of a phosphor layer on the surfaces, the color point of the light emitted from the device can be tuned as desired.

In one example, a single type of wavelength converting material may be patterned on a portion of transmissive element 174. By way of example, a red emitting phosphor 186 may be patterned on different areas of the transmissive element 174 and a yellow emitting phosphor 184 may be patterned on other areas of transmissive element 174. In some examples, the areas may be physically separated from one another. In some other examples, the areas may be adjacent to one another. The coverage and/or concentrations of the phosphors may be varied to produce different color temperatures. It should be understood that the coverage area of the red and/or the concentrations of the red and yellow phosphors will need to vary to produce the desired color temperatures if the light produced by the LEDs 162 varies. The color performance of the LEDs 162, red phosphor and the yellow phosphor may be measured and modified by any of adding or removing phosphor material based on performance so that the final assembled product produces the desired color temperature.

Transmissive element 174 may be constructed from a suitable optically transmissive material (e.g., sapphire, quartz, alumina, crown glass, polycarbonate, and other plastics). Transmissive element 174 is spaced above the light emitting surface of LEDs 162 by a clearance distance. In some embodiments, this is desirable to allow clearance for wire bond connections from the LED package submount to the active area of the LED. In some embodiments, a clearance of one millimeter or less is desirable to allow clearance for wire bond connections. In some other embodiments, a clearance of two hundred microns or less is desirable to enhance light extraction from the LEDs 162.

In some other embodiments, the clearance distance may be determined by the size of the LED 162. For example, the size of the LED 162 may be characterized by the length dimension of any side of a single, square shaped active die area. In some other examples, the size of the LED 162 may be characterized by the length dimension of any side of a rectangular shaped active die area. Some LEDs 162 include many active die areas (e.g., LED arrays). In these examples, the size of the LED 162 may be characterized by either the size of any individual die or by the size of the entire array. In some embodiments, the clearance should be less than the size of the LED 162. In some embodiments, the clearance should be less than twenty percent of the size of the LED 162. In some embodiments, the clearance should be less than five percent of the size of the LED. As the clearance is reduced, light extraction efficiency may be improved, but output beam uniformity may also degrade.

In some other embodiments, it is desirable to attach transmissive element 174 directly to the surface of the LED 162. In this manner, the direct thermal contact between transmissive element 174 and LEDs 162 promotes heat dissipation from LEDs 162. In some other embodiments, the space between mounting board 164 and transmissive element 174 may be filled with a solid encapsulate material. By way of example, silicone may be used to fill the space. In some other embodiments, the space may be filled with a fluid to promote heat extraction from LEDs 162.

In the embodiment illustrated in FIG. 9, the surface of patterned transmissive element 174 facing LEDs 162 is coupled to LEDs 162 by an amount of flexible, optically translucent material 177. By way of non-limiting example, the flexible, optically translucent material 177 may include an adhesive, an optically clear silicone, a silicone loaded with reflective particles (e.g., titanium dioxide (TiO2), zinc oxide (ZnO), and barium sulfate (BaSO4) particles, or a combination of these materials), a silicone loaded with a wavelength converting material (e.g., phosphor particles), a sintered PTFE material, etc. Such material may be applied to couple transmissive element 174 to LEDs 162 in any of the embodiments described herein.

In some embodiments, multiple, stacked transmissive layers are employed. Each transmissive layer includes different wavelength converting materials. For example, a transmissive layer including a wavelength converting material may be placed over another transmissive layer including a different wavelength converting material. In this manner, the color point of light emitted from LED based illumination device 100 may be tuned by replacing the different transmissive layers independently to achieve a desired color point. In some embodiments, the different transmissive layers may be placed in contact with each other to promote light extraction. In some other embodiments, the different transmissive layers may be separated by a distance to promote cooling of the transmissive layers. For example, airflow may by introduced through the space to cool the transmissive layers.

The mounting board 164 provides electrical connections to the attached LEDs 162 to a power supply (not shown). In one embodiment, the LEDs 162 are packaged LEDs, such as the Luxeon Rebel manufactured by Philips Lumileds Lighting. Other types of packaged LEDs may also be used, such as those manufactured by OSRAM (Ostar package), Luminus Devices (USA), Cree (USA), Nichia (Japan), or Tridonic (Austria). As defined herein, a packaged LED is an assembly of one or more LED die that contains electrical connections, such as wire bond connections or stud bumps, and possibly includes an optical element and thermal, mechanical, and electrical interfaces. The LEDs 162 may include a lens over the LED chips. Alternatively, LEDs without a lens may be used. LEDs without lenses may include protective layers, which may include phosphors. The phosphors can be applied as a dispersion in a binder, or applied as a separate plate. Each LED 162 includes at least one LED chip or die, which may be mounted on a submount. The LED chip typically has a size about 1 mm by 1 mm by 0.5 mm, but these dimensions may vary. In some embodiments, the LEDs 162 may include multiple chips. The multiple chips can emit light similar or different colors, e.g., red, green, and blue. The LEDs 162 may emit polarized light or non-polarized light and LED based illumination device 100 may use any combination of polarized or non-polarized LEDs. In some embodiments, LEDs 162 emit either blue or UV light because of the efficiency of LEDs emitting in these wavelength ranges. In addition, different phosphor layers may be applied on different chips on the same submount. The submount may be ceramic or other appropriate material. The submount typically includes electrical contact pads on a bottom surface that are coupled to contacts on the mounting board 164. Alternatively, electrical bond wires may be used to electrically connect the chips to a mounting board. Along with electrical contact pads, the LEDs 162 may include thermal contact areas on the bottom surface of the submount through which heat generated by the LED chips can be extracted. The thermal contact areas are coupled to heat spreading layers on the mounting board 164. Heat spreading layers may be disposed on any of the top, bottom, or intermediate layers of mounting board 164. Heat spreading layers may be connected by vias that connect any of the top, bottom, and intermediate heat spreading layers.

In some embodiments, the mounting board 164 conducts heat generated by the LEDs 162 to the sides of the board 164 and the bottom of the board 164. In one example, the bottom of mounting board 164 may be thermally coupled to a heat sink, or a lighting fixture and/or other mechanisms to dissipate the heat, such as a fan. In some embodiments, the mounting board 164 conducts heat to a heat sink thermally coupled to the top of the board 164. Mounting board 164 may be an FR4 board, e.g., that is 0.5 mm thick, with relatively thick copper layers, e.g., 30 micrometers to 100 micrometers, on the top and bottom surfaces that serve as thermal contact areas. In other examples, the board 164 may be a metal core printed circuit board (PCB) or a ceramic submount with appropriate electrical connections. Other types of boards may be used, such as those made of alumina (aluminum oxide in ceramic form), or aluminum nitride (also in ceramic form).

Mounting board 164 includes electrical pads to which the electrical pads on the LEDs 162 are connected. The electrical pads are electrically connected by a metal, e.g., copper, trace to a contact, to which a wire, bridge or other external electrical source is connected. In some embodiments, the electrical pads may be vias through the board 164 and the electrical connection is made on the opposite side, i.e., the bottom, of the board. Mounting board 164, as illustrated, is rectangular in dimension. LEDs 162 mounted to mounting board 164 may be arranged in different configurations on rectangular mounting board 164. In one example LEDs 162 are aligned in rows extending in the length dimension and in columns extending in the width dimension of mounting board 164. In another example, LEDs 162 are arranged in a hexagonally closely packed structure. In such an arrangement each LED is equidistant from each of its immediate neighbors. Such an arrangement is desirable to increase the uniformity and efficiency of emitted light.

Figure 13:
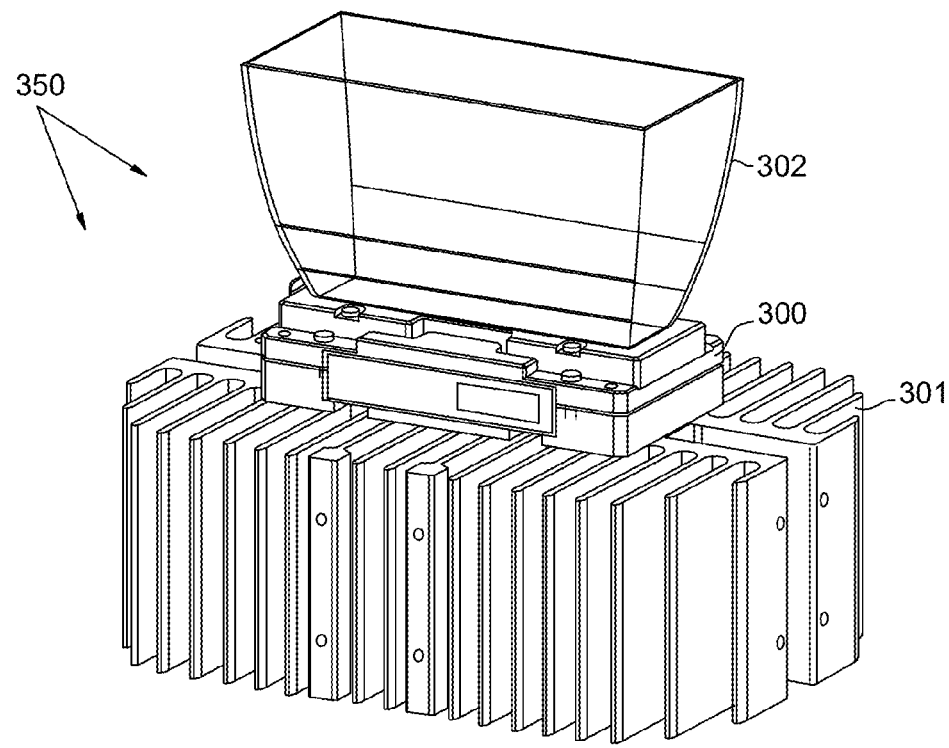
FIG. 13 depicts a perspective view of a luminaire including an LED based illumination device with a rectangular form factor.
Figure 14:
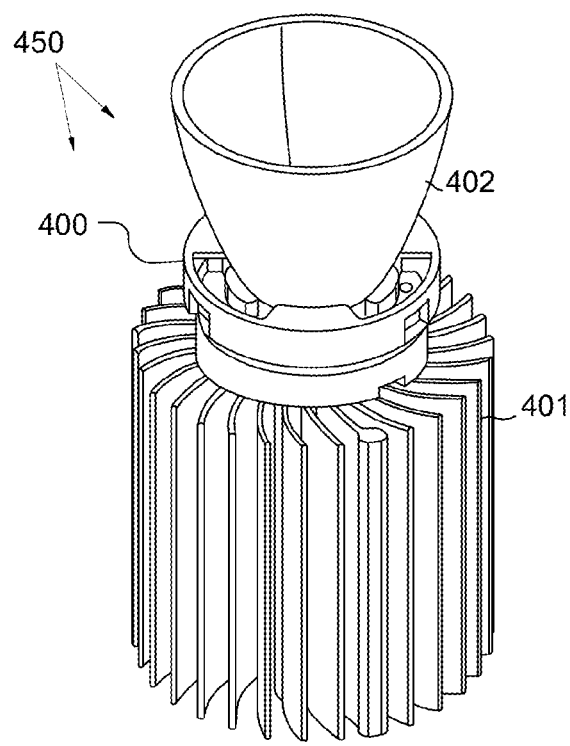
FIG. 14 depicts a perspective view of a luminaire including an LED based illumination device with a circular form factor.
Figure 15:
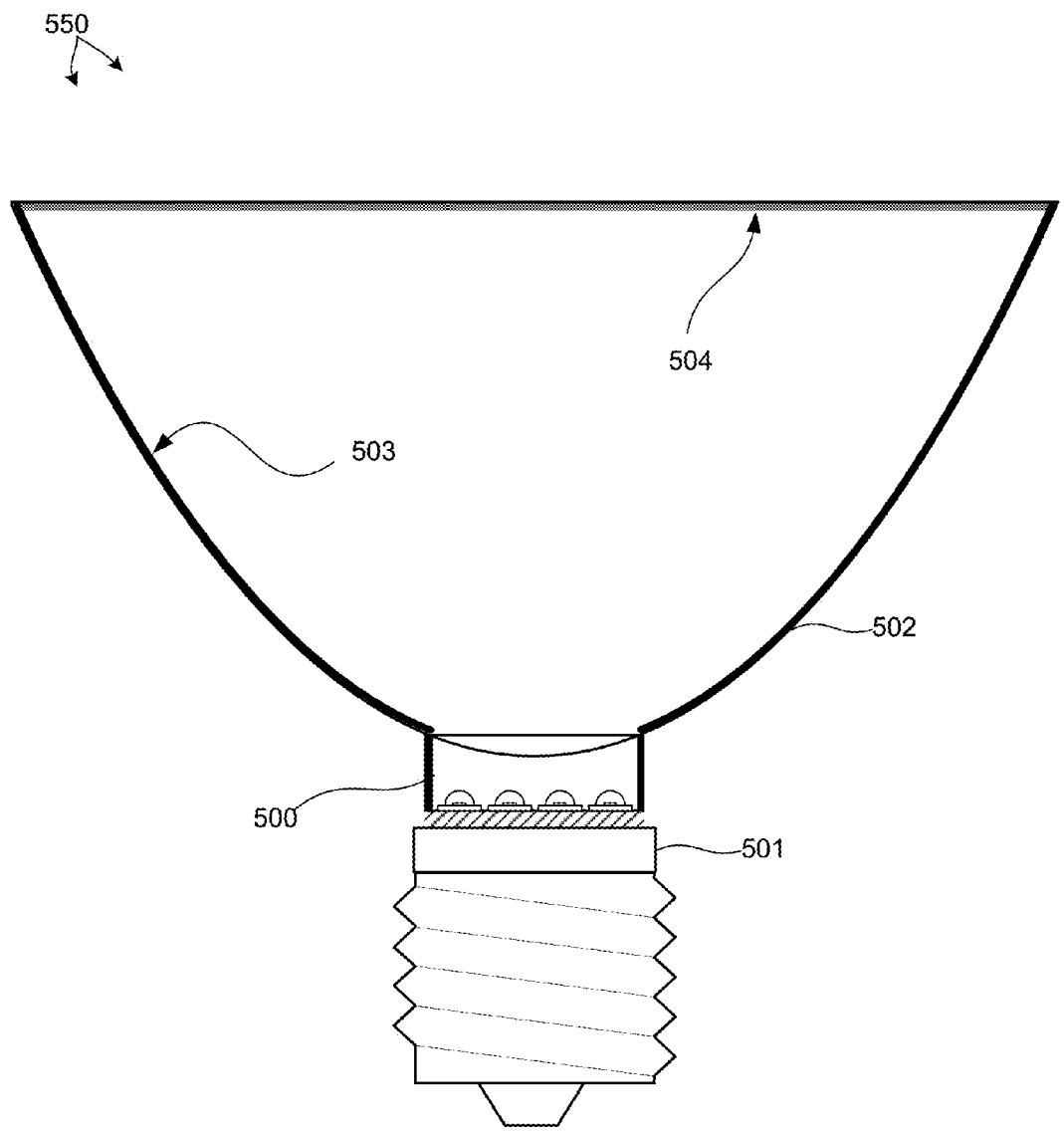
FIG. 15 depicts a side view of a luminaire including an LED based illumination device integrated into a retrofit lamp device.

FIGS. 13, 14, and 15 illustrate three exemplary luminaires. Luminaire 350 illustrated in FIG. 13 includes an LED based illumination device 300 with a rectangular form factor. The luminaire 450 illustrated in FIG. 14 includes an LED based illumination device 400 with a circular form factor. The luminaire 550 illustrated in FIG. 15 includes an LED based illumination device 500 integrated into a retrofit lamp device. These examples are for illustrative purposes. Examples of LED based illumination devices of general polygonal and elliptical shapes may also be contemplated.

Luminaires 350, 450, and 550 include LED based illumination devices 300, 400, and 500, which may be similar to the LED based illumination devices described above, reflectors 302, 402, and 502, and light fixtures 301, 401, and 501, respectively. As depicted, the light fixtures include a heat sink capability, and therefore may be sometimes referred to as a heat sink. However, the light fixtures may include other structural and decorative elements (not shown). The reflectors are mounted to the LED based illumination devices to collimate or deflect light emitted from each LED based illumination device. Reflectors may be made from a thermally conductive material, such as a material that includes aluminum or copper and may be thermally coupled to each LED based illumination device. Heat flows by conduction through the LED based illumination device and the thermally conductive reflector. Heat also flows via thermal convection over the reflector. Reflectors may be compound parabolic concentrators, where the concentrator is constructed of or coated with a highly reflecting material. Optical elements, such as a diffuser or reflector may be removably coupled to an LED based illumination device, e.g., by means of threads, a clamp, a twist-lock mechanism, or other appropriate arrangement. As illustrated in FIG. 15, the reflector 502 may include sidewalls 503 and a window 504 that are optionally coated, e.g., with a wavelength converting material, diffusing material or any other desired material.

As depicted in FIGS. 13, 14, and 15, the LED based illumination device is mounted to a heat sink. The heat sink may be made from a thermally conductive material, such as a material that includes aluminum or copper and may be thermally coupled to an LED based illumination device. Heat flows by conduction through an LED based illumination device and the thermally conductive heat sink. Heat also flows via thermal convection over the heat sink. Each LED based illumination device may be attached to a heat sink by way of screw threads to clamp the LED based illumination device to the heat sink. To facilitate easy removal and replacement, the LED based illumination device may be removably coupled to the heat sink, e.g., by means of a clamp mechanism, a twist-lock mechanism, or other appropriate arrangement. The LED based illumination device includes at least one thermally conductive surface that is thermally coupled to the heat sink, e.g., directly or using thermal grease, thermal tape, thermal pads, or thermal epoxy. For adequate cooling of the LEDs, a thermal contact area of at least 50 square millimeters, but preferably 100 square millimeters should be used per one watt of electrical energy flow into the LEDs on the board. For example, in the case when 20 LEDs are used, a 1000 to 2000 square millimeter heat sink contact area should be used. Using a larger heat sink may permit the LEDs to be driven at higher power, and also allows for different heat sink designs. For example, some designs may exhibit a cooling capacity that is less dependent on the orientation of the heat sink. In addition, fans or other solutions for forced cooling may be used to remove the heat from the device. The bottom heat sink may include an aperture so that electrical connections can be made to the LED based illumination device.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An LED based illumination device, comprising:
a plurality of LEDs mounted to a top surface of an LED mounting board, wherein the LED mounting board includes a heat dissipating bottom surface opposite the top surface of the LED mounting board;
a heat sink disposed below the LED mounting board and in contact with the heat dissipating bottom surface;
a peripheral electrical circuit board disposed below light emitting surfaces of the plurality of LEDs and surrounding at least a portion of the heat sink;
a primary electrical circuit board electrically coupled to the peripheral electrical circuit board and electrically coupled to the LED mounting board to supply electrical current to the plurality of LEDs, wherein the primary electrical circuit board surrounds at least a portion of the heat sink and is parallel to the peripheral electrical circuit board; and a housing configured to capture the LED mounting board, the heat sink and the peripheral electrical circuit board.

2. The LED based illumination device of claim 1, wherein the housing is also configured to capture the primary electrical circuit board.

3. The LED based illumination device of claim 1, wherein the LED mounting board is electrically coupled to the primary electrical circuit board by a plurality of compliant electrical contact elements.

4. The LED based illumination device of claim 1, wherein a radio frequency transmitter is coupled to the peripheral electrical circuit board.

5. The LED based illumination device of claim 1, wherein a radio frequency transceiver is coupled to the peripheral electrical circuit board.

6. The LED based illumination device of claim 5, wherein the peripheral electrical circuit board includes an antenna coupled to the radio frequency transceiver.

7. The LED based illumination device of claim 5, wherein the housing includes an antenna coupled to the radio frequency transceiver.

8. The LED based illumination device of claim 1, wherein the peripheral electrical circuit board includes a sensor element exposed to an amount of light emitted from the LED based illumination device.

9. The LED based illumination device of claim 1, wherein a sensor element exposed to an environment illuminated by the LED based illumination device is communicatively coupled to the peripheral electrical circuit board.

10. The LED based illumination device of claim 9, wherein a command signal that causes a change in a luminous output of the LED based illumination device is determined based at least in part on a sensor signal received from the sensor element.

11. The LED based illumination device of claim 9, wherein the sensor element is an optical sensor.

12. The LED based illumination device of claim 1, wherein the LED mounting board includes a sensor element exposed to an amount of light emitted from the LED based illumination device.

13. The LED based illumination device of claim 1, wherein the LED mounting board includes an amount of memory.

14. An LED based illumination device, comprising:
a housing configured to capture an LED based light engine that includes a plurality of LEDs mounted to an LED mounting board, wherein an amount of light emitted by the LED based light engine passes through an output port of the housing, wherein the housing is configured to be attachable to a heat sink such that a bottom surface of the LED mounting board is in contact with the heat sink when the housing is attached to the heat sink;
a peripheral electrical circuit board configured to be captured by the housing, wherein the peripheral electrical circuit board includes a radio frequency (RF) transceiver configured to communicate data between the LED based illumination device and another electronic device; and
a primary electrical circuit board configured to be captured by the housing and electrically coupled to the LED based light engine and the peripheral electrical circuit board, wherein the primary electrical circuit board includes an LED driver configured to supply electrical current to the plurality of LEDs, and wherein the primary electrical circuit board is attached to the heat sink to dissipate heat from the LED driver to the heat sink.

15. The LED based illumination device of claim 14, further comprising:
an antenna disposed on the peripheral electrical circuit board and electrically coupled to the RF transceiver.

16. The LED based illumination device of claim 14, further comprising:
an antenna disposed on the housing and electrically coupled to the RF transceiver.

17. The LED based illumination device of claim 14, wherein the primary electrical circuit board is located between the heat sink and the peripheral electrical circuit board.

18. The LED based illumination device of claim 14, wherein the RF transceiver of the peripheral electrical circuit board is configured to communicate an amount of diagnostic data received from the primary electrical circuit board.

19. The LED based illumination device of claim 14, wherein the LED driver is configured to supply the electrical current to the plurality of LEDs based on a command signal received from the peripheral electrical circuit board.

20. The LED based illumination device of claim 19, wherein the peripheral electrical circuit board includes a processor configured to determine the command signal based on a sensor signal received from a sensor mounted to the peripheral electrical circuit board.

21. The LED based illumination device of claim 20, wherein the sensor is any of a temperature sensor, a humidity sensor, an optical sensor, a pressure sensor, a vibration sensor, and an orientation sensor.

22. The LED based illumination device of claim 19, wherein the peripheral electrical circuit board includes a processor configured to determine the command signal based on a sensor signal received from a sensor mounted to the LED based light engine.

23. The LED based illumination device of claim 19, wherein the peripheral electrical circuit board includes a processor configured to determine the command signal based on a sensor signal received from a sensor mounted to a reflector coupled to the LED based light engine.

24. The LED based illumination device of claim 23, wherein the sensor is any of a temperature sensor, a humidity sensor, an optical sensor, a pressure sensor, a vibration sensor, and an orientation sensor.

25. A light control and data interface module comprising:
a primary electrical circuit board couplable to an electrical power supply and an LED based light engine, the primary electrical circuit board configured to receive an amount of electrical power from the electrical power supply and supply electrical current to the LED based light engine; and
a peripheral electrical circuit board coupled to the primary electrical circuit board, wherein the primary electrical circuit board is configured to supply electrical power to the peripheral electrical circuit board, and wherein the peripheral electrical circuit board includes a radio frequency (RF) transceiver configured to communicate data to an external electronic device;
wherein the peripheral electrical circuit board and the primary electrical circuit board are configured to be mounted with the primary electrical circuit board parallel to the peripheral electrical circuit board, wherein the primary electrical circuit board includes an LED driver configured to supply the electrical current to the LED based light engine, and wherein the primary electrical circuit board is attached to a heat sink to dissipate heat from the LED driver to the heat sink.

26. The light control and data interface module of claim 25, wherein the peripheral electrical circuit board includes:
   a processor; and
   a non-transitory, computer readable medium storing instructions that when executed by the processor cause the peripheral electrical circuit board to:
      receive a control signal on a first input node;
      determine a desired luminous output of the LED based light engine based on the control signal; and
      transmit a command signal to a direct current to direct current (DC/DC) power converter mounted to the primary electrical circuit board, wherein the DC/DC power converter is configured to supply the electrical current to the LED based light engine.

27. The light control and data interface module of claim 26, wherein the control signal adheres to any of a Digital Addressable Lighting Interface (DALI) standard, a DMX standard, and a 0-10 Volt standard.

28. The light control and data interface module of claim 25, wherein the peripheral electrical circuit board includes:
   a processor; and
   a non-transitory, computer readable medium storing instructions that when executed by the processor cause the peripheral electrical circuit board to:
      receive a sensor signal on a first input node;
      determine a desired luminous output of the LED based light engine based on the sensor signal; and
      transmit a command signal to a direct current to direct current (DC/DC) power converter mounted to the primary electrical circuit board, wherein the DC/DC power converter is configured to supply the electrical current to the LED based light engine.

29. The light control and data interface module of claim 28, wherein the sensor signal is received from a sensor coupled a reflector mounted to the LED based light engine.

* * * * *